(12) United States Patent
Lin et al.

(10) Patent No.: US 9,383,875 B2
(45) Date of Patent: Jul. 5, 2016

(54) TOUCH PANEL

(71) Applicant: TPK Touch Solutions (Xiamen) Inc., Xiamen (CN)

(72) Inventors: Yalu Lin, Xiamen (CN); Jing Yu, Xiamen (CN); Yuncong Su, Xiamen (CN); Li Huang, Putian (CN)

(*) Notice: Subject to any disclaimer, the term of this patent is extended or adjusted under 35 U.S.C. 154(b) by 27 days.

(21) Appl. No.: 14/299,845

(22) Filed: Jun. 9, 2014

(65) Prior Publication Data

US 2015/0355747 A1    Dec. 10, 2015

(30) Foreign Application Priority Data

Jun. 8, 2014    (CN) .......................... 2013 1 0228299

(51) Int. Cl.

| | | |
|---|---|---|
| G06F 3/045 | (2006.01) | |
| G06F 3/044 | (2006.01) | |
| H01L 23/00 | (2006.01) | |
| H03K 17/96 | (2006.01) | |
| G06F 3/041 | (2006.01) | |
| G06F 1/16 | (2006.01) | |

(52) U.S. Cl.
CPC .............. *G06F 3/044* (2013.01); *G06F 3/0416* (2013.01); *H01L 24/06* (2013.01); *H03K 17/962* (2013.01); *G06F 1/16* (2013.01); *G06F 2203/04103* (2013.01); *G06F 2203/04111* (2013.01)

(58) Field of Classification Search
None
See application file for complete search history.

(56) References Cited

U.S. PATENT DOCUMENTS

| | | | | |
|---|---|---|---|---|
| 8,227,915 | B2* | 7/2012 | Lu ..................... | H01L 23/49811 257/737 |
| 8,427,446 | B2* | 4/2013 | Lan ........................ | G06F 3/044 178/18.03 |
| 9,111,706 | B2* | 8/2015 | Chen ...................... | G06F 3/041 |
| 9,203,403 | B2* | 12/2015 | Chiu ..................... | H03K 17/962 |
| 9,204,529 | B2* | 12/2015 | Ye ........................ | H05K 1/0213 |
| 2005/0099402 | A1* | 5/2005 | Nakanishi ............. | G06F 3/0412 345/173 |
| 2009/0321867 | A1* | 12/2009 | Leib ..................... | B81C 1/00333 257/434 |
| 2011/0134056 | A1* | 6/2011 | Kim ....................... | G06F 3/0412 345/173 |
| 2012/0081300 | A1* | 4/2012 | Chan ...................... | G06F 3/044 345/173 |
| 2012/0127092 | A1* | 5/2012 | Lee ........................ | G06F 3/044 345/173 |
| 2012/0268402 | A1* | 10/2012 | Wang ..................... | G06F 3/041 345/173 |
| 2013/0140083 | A1* | 6/2013 | Izawa ........................ | G09J 1/00 174/94 R |
| 2013/0207922 | A1* | 8/2013 | Gillmore ................. | G06F 3/044 345/174 |
| 2013/0314625 | A1* | 11/2013 | Tsai ........................ | G06F 3/044 349/12 |
| 2014/0001635 | A1* | 1/2014 | Chen ....................... | H01L 24/11 257/751 |
| 2014/0049892 | A1* | 2/2014 | Huang .................... | G06F 3/044 361/679.21 |
| 2014/0062909 | A1* | 3/2014 | Choi ........................ | G09G 3/32 345/173 |
| 2014/0063097 | A1* | 3/2014 | Liu .......................... | G06F 3/041 347/12 |
| 2014/0078691 | A1* | 3/2014 | Huang .................. | H05K 1/0268 361/749 |
| 2014/0118967 | A1* | 5/2014 | Lee ........................ | G06F 3/041 361/749 |
| 2014/0132861 | A1* | 5/2014 | Wang ...................... | G06F 3/044 349/12 |
| 2014/0159255 | A1* | 6/2014 | Li ........................... | H01L 23/60 257/782 |
| 2014/0320761 | A1* | 10/2014 | Misaki .................... | G06F 3/044 349/12 |

FOREIGN PATENT DOCUMENTS

CN      101907906 A      12/2010

\* cited by examiner

*Primary Examiner* — Dismery Mercedes (57) ABSTRACT

A touch panel is provided. The touch panel includes at least a bonding pad, a touch-sensing structure and at least a protection component. The bonding pad has a first long side, a first short side, a second long side, and a second short side. The first long side is adjacent to the first short side and the second short side, and the first long side is opposite to the second long side. A touch-sensing structure is electrically connected to the first short side of the bonding pad. The protection component is disposed at the first long side and the second long side.

16 Claims, 8 Drawing Sheets

TOUCH PANEL

This Application claims priority of the People's Republic of China Patent Application No. 201310228299.1, filed on Jun. 8, 2013, the entirety of which is incorporated by reference herein.

BACKGROUND OF THE INVENTION

1. Field of the Invention

The present disclosure relates to touch technology, and in particular, relates to a touch panel.

2. Description of the Related Art

Recently, touch panel techniques have been developed to be a main input interface and have been popularly applied in various electronic products, such as mobile phones, personal digital assistants (PDA), and handheld personal computers. Touch-sensing elements of the touch panel are electrically connected to bonding pads through wires and the bonding pads are bonded with a flexible printed circuit board. Therefore, sensing-signals of the touch-sensing elements can be conveyed to an exterior processor for performing a treatment of the sensing-signals.

In general, the touch-sensing elements and the wires are electrically connected together by a front-to-rear connection (or a head-to-end connection) method. Therefore, a protection element is disposed directly on the touch-sensing elements and the wires to prevent the touch-sensing elements and wires from being affected by the environment or the other processes. However, the bonding pads and the flexible printed circuit board are electrically connected together by an upper-to-lower overlapping connection method. There is usually no protection element disposed on the bonding pads to avoid affecting the conductive behavior between the bonding pads and the flexible printed circuit board. The bonding pads are usually formed by stacking several layers of conductive elements, wherein a middle-layered conductive element is formed of a better conductive material, for example aluminum, to enhance the conductivity of the bonding pads. However, the materials of better conductivity usually provide poor protection against the environment or other processes. Therefore, conductive elements having a better protective function, for example molybdenum, are used as an upper-layered conductive element and a lower-layered conductive element to form the bonding pads. Although the upper surface and the lower surface of the middle-layered conductive element of the bonding pad are protected by the other conductive elements, the sidewalls of the middle-layered conductive element of the bonding pad are not protected by any protection element and may be affected by the environment, for example oxidation or other processes, through for example a process using an acid solution, a basic solution, or a cleaning liquid. As a result, the conductive quality between the bonding pads of the touch panel and the flexible printed circuit board is poor and the reliability of the touch panel is thereby reduced.

BRIEF SUMMARY OF THE INVENTION

The disclosure provides touch panels which can overcome the above-mentioned problems of conventional touch panels. According to embodiments of the disclosure, a protection component is disposed at least at the sides of the bonding pads. Therefore, the above-mentioned problems of the sides of the bonding pads of the conventional touch panels being easily damaged by the environment or other processes are overcome.

According to an embodiment of the disclosure, a touch panel is provided. The touch panel comprises at least a bonding pad, a touch-sensing structure and at least a protection component. The bonding pad has a first long side, a second long side, a first short side, and a second short side, wherein the first long side is adjacent to the first short side and the second short side, and opposite to the second long side. The touch-sensing structure is electrically connected to the first short side of the bonding pad. Furthermore, the protection component is disposed at the first long side and the second long side of the bonding pad.

According to the embodiments of the disclosure, at least the first long side and the second long side of the bonding pad are covered by the protection component. Thus, the sides of the bonding pads of the touch panels easily damaged by the environment or other processes are overcome. The bonding quality of the bonding pads with the flexible printed circuit board is enhanced and thus the reliability of the touch panel is also enhanced.

A detailed description is given in the following embodiments with reference to the accompanying drawings.

DETAILED DESCRIPTION OF THE EMBODIMENTS

The following description is of the best-contemplated mode of carrying out the invention. This description is made for the purpose of illustrating the general principles of the invention and should not be taken in a limiting sense. The scope of the invention is best determined by reference to the appended claims.

In the accompanying drawings, in order to clearly illustrate the characteristics of embodiments of the invention, each element in the touch panels may not be drawn to scale. Moreover, in the descriptions that follow, the orientations of "on", "over", "above", "under" and "below" are used for representing a direction of a cover lens 101 of the touch panel disposed at the underside, except for FIG. 9. The orientations are only used for representing the relationship between the relative positions of each element in the touch panel. However, in an actual application of the touch panel, the cover lens 101 is disposed at the top of the touch panel for users.

Figure 1:
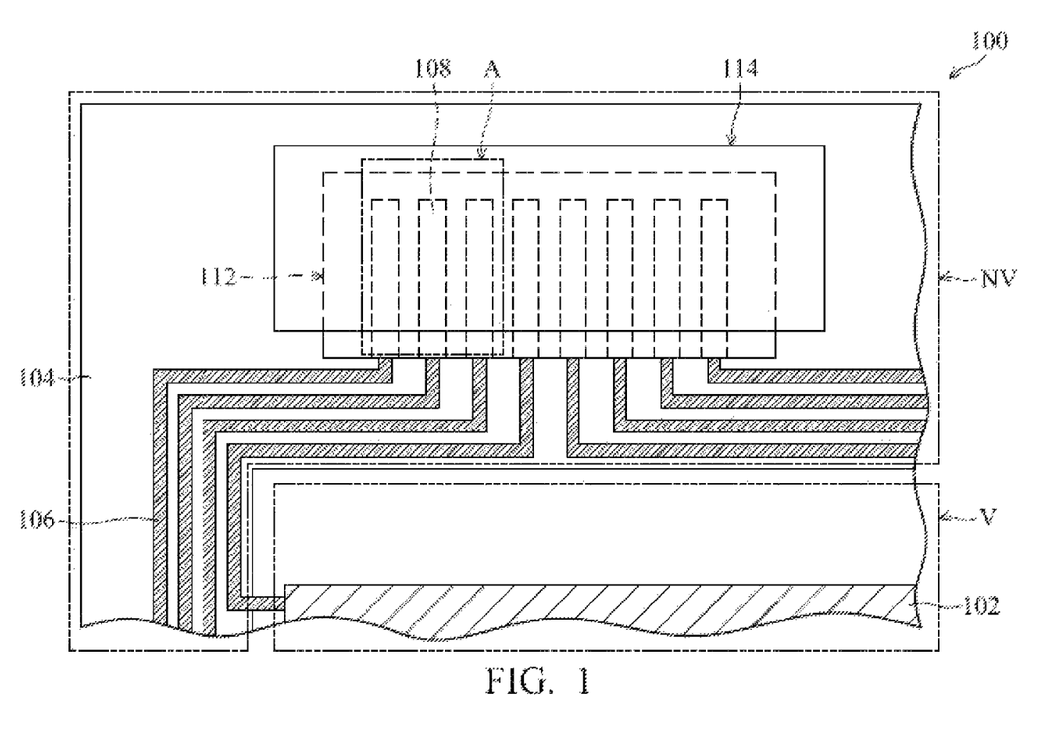
FIG. 1 shows an illustrative partial plane view of a touch panel according to an embodiment of the disclosure.

Referring to FIG. 1, a partial plane view of a touch panel 100 according to an embodiment of the present disclosure is shown. As shown in FIG. 1, the touch panel 100 comprises at least a bonding pad 108, a touch-sensing structure 102, and at least a protection component 112. There are eight bonding pads 108 shown in FIG. 1, which is illustrated as an example, but does not limit the present invention. The bonding pads 108 are disposed apart from each other and parallel to each other. The touch-sensing structure 102 may be formed of any patterns and any structures which are known in the art and are not described in detail. The touch-sensing structure 102 is electrically connected the corresponding bonding pads 108 through a plurality of wires 106. These bonding pads 108 are bonded to a plurality of metal pads (not shown) of a flexible printed circuit board 114 through conductive glue (not shown), such that sensing signals of the touch-sensing structure 102 can be conveyed to an exterior signal processor (not shown) through the wires 106, the bonding pads 108, the conductive glue, and the flexible printed circuit board 114 for performing a signal treatment of the sensing signals by the exterior signal processor.

According to an embodiment of the present disclosure, the touch panel 100 further comprises a mask layer 104. The touch panel 100 is defined to have a viewable area V and a non-viewable area NV through the mask layer 104. The mask layer 104, the bonding pads 108 and the wires 106 are disposed at the non-viewable area NV and the touch-sensing structure 102 is disposed at the viewable area V. The bonding pads 108 can be formed on the mask layer 104 at the non-viewable area NV. Furthermore, a protection component 112 is formed on the bonding pads 108 to prevent at least one side of the bonding pads 108 from being damaged by the environment or other processes of fabricating the touch panel.

FIG. 1 only shows an illustrative forming area of the protection component 112, but a detailed structure of the protection component 112 is not shown. Referring to subsequent FIGS. 2A to 7B, various plane views and cross sections of the protection component 112 and the bonding pads 108 according to various embodiments of the present disclosure are shown, and various structures of the protection component 112 are also described in detail as below.

Figure 2A:
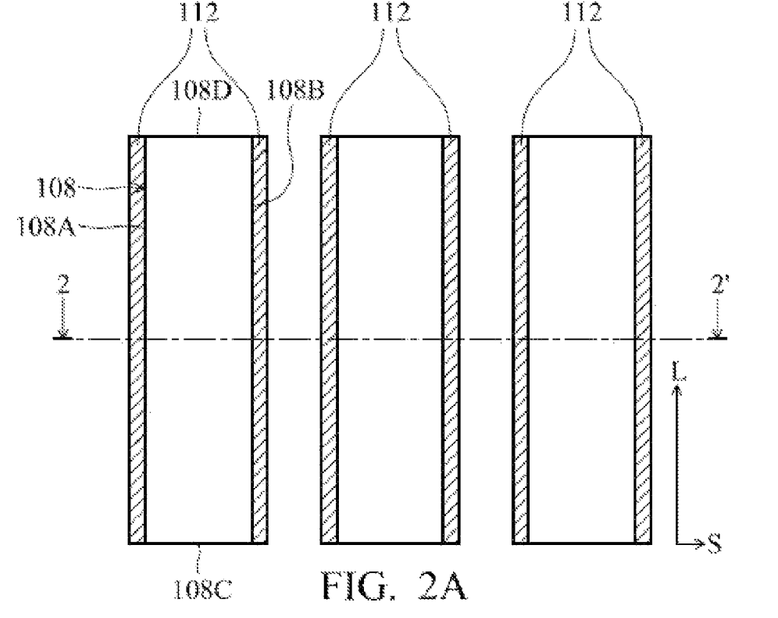
FIG. 2A shows an illustrative plane view of a protection component and a bonding pad in the dotted-line area A of FIG. 1 according to an embodiment of the disclosure.

Referring to FIG. 2A, a plane view of protection components and bonding pads in the dotted-line area A of FIG. 1 according to an embodiment of the present disclosure is shown. As shown in FIG. 2A, each bonding pad 108 has a first long side 108A, a second long side 108B, a first short side 108C, and a second short side 108D, wherein the first long side 108A is adjacent to the first short side 108C and the second short side 108D, and the first long side 108A is opposite to the second long side 108B. The first short side 108C is electrically connected to a touch-sensing structure (not shown in FIG. 2A) through a wire. A long-axial direction L is defined along a long side of the bonding pad 108 and a short-axial direction S is defined along a short side of the bonding pad 108. The long-axial direction L and the short-axial direction S are perpendicular to one another. The first long side 108A and the second long side 108B are disposed along the long-axial direction L and parallel to one another. The first short side 108C and the second short side 108D are disposed along the short-axial direction S and parallel to one another. The protection component 112 is disposed at the first long side 108A and the second long side 108B of the bonding pad 108 to shield the first long side 108A and the second long side 108B. The protection component 112 can prevent the first long side 108A and the second long side 108B from being exposed and damaged by the environment or the subsequent processes of fabricating the touch panel. The top surface of the protection component 112 at the two long sides of the bonding pad 108 is preferably at least level with the top surface of the bonding pad 108. Because the first short side 108C and the second short side 108D have a smaller cross-section area than that of the first long side 108A and the second long side 108B and the first short side 108C is further connected with the touch-sensing structure, the effect of the first short side 108C and the second short side 108D being damaged by the environment or the subsequent processes of fabricating the touch panel is less than that of the first long side 108A and the second long side 108B. Therefore, the touch panel can have no protection component disposed at the first short side 108C and the second short side 108D. However, in the other embodiments, the protection component 112 is further disposed at the second short side 108D to shield the second short side 108D for more completely protecting the sides of the bonding pad 108. Therefore, the damage issue of the second short side 108D of the bonding pad 108 is further overcome. The material of the protection component 112 may be an insulating material, for example polyimide. In one embodiment, the protection component 112 can be formed by a coating, exposure and development process. In another embodiment, the pattern of the protection component 112 can be directly formed by a printing process. The bonding pad 108 may be formed by top-down stacking a first metal layer, a second metal layer and a third metal layer in order. The first metal layer and the third metal layer are conductive elements with a protective function, which can be formed from metal materials such as molybdenum, chromium, titanium, molybdenum-niobium alloy, etc. The second metal layer can be formed from a material with better conductivity, such as aluminum, aluminum-neodymium alloy, etc., to enhance the conductivity of the bonding pad. In another embodiment, because the first metal layer and the third metal layer are conductive elements with a protective function, the protection component 112 is disposed at the first long side 108A and the second long side 108B, i.e., the protection component 112 can only be disposed at the two long sides of the second metal layer.

Referring to FIG. 1 and FIG. 2A, in another embodiment, the protection component 112 further extends to cover the wires 106 and has a protective function for the wires 106 at the same time. The wires 106 do not need to bond with the flexible printed circuit board 114, such that the protection component 112 over the wires 106 can be a whole-layered insulating protection component. In the other embodiments, the wires 106 may be protected by other methods or other components.

Figure 2B:
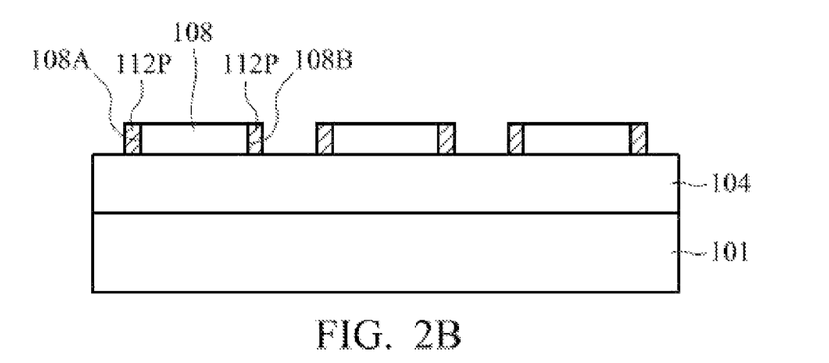
FIG. 2B shows an illustrative cross section of a touch panel along the cross section line 2-2' of FIG. 2A.

Referring to FIG. 2B, a cross section of the touch panel along the cross section line 2-2' of FIG. 2A is shown. As shown in FIG. 1 and FIG. 2B, the touch panel further comprises a cover lens 101 having a lower surface (viewed from a touch side of the touch panel). The mask layer 104 is formed on the lower surface of the cover lens 101 and the cover lens 101 is divided into the viewable area V and the non-viewable area NV by the mask layer 104. The touch-sensing structure 102 is formed on the lower surface of the cover lens 101 at the viewable area V. The bonding pads 108 are formed on the mask layer 104, i.e., the mask layer 104 is disposed between the cover lens 101 and the bonding pads 108. An upper surface opposite to the lower surface of the cover lens 101 is used as the touch side for users.

During the processes of forming the other elements of the touch panel, such as a photolithography process and an etching process for forming the touch-sensing structure, the edges of the bonding pads 108 are easily etched by an acid solution, a basic solution and a cleaning liquid used in the above-mentioned processes. Thus, the bonding quality of the bonding pads 108 with the flexible printed circuit board is reduced. The long sides of the bonding pads 108 are more easily damaged by the other processes due to the bigger contact areas of the long sides. According to the embodiment of the present disclosure, at least two long sides 108A and 108B of each bonding pad 108 are shielded by the protection component 112 and not exposed. Therefore, the problem of corrosion occurring at the edges of the bonding pads 108 can be overcome more effectively.

In addition, according to the above embodiments of the touch panels, the protection component 112 is formed on the bonding pads 108. Therefore, even if a gas released from a black photo-resist of forming the mask layer 104 during a sputtering process of depositing the bonding pads 108 may affect the adhesion between the bonding pads 108 and the mask layer 104, the protection component 112 covering the two long sides 108A and 108B of the bonding pad 108 will enhance the adhesion between the bonding pads 108 and the mask layer 104. Thus, the issue of the bonding pad 108 peeling from the mask layer 104 can be overcome.

Figure 3A:
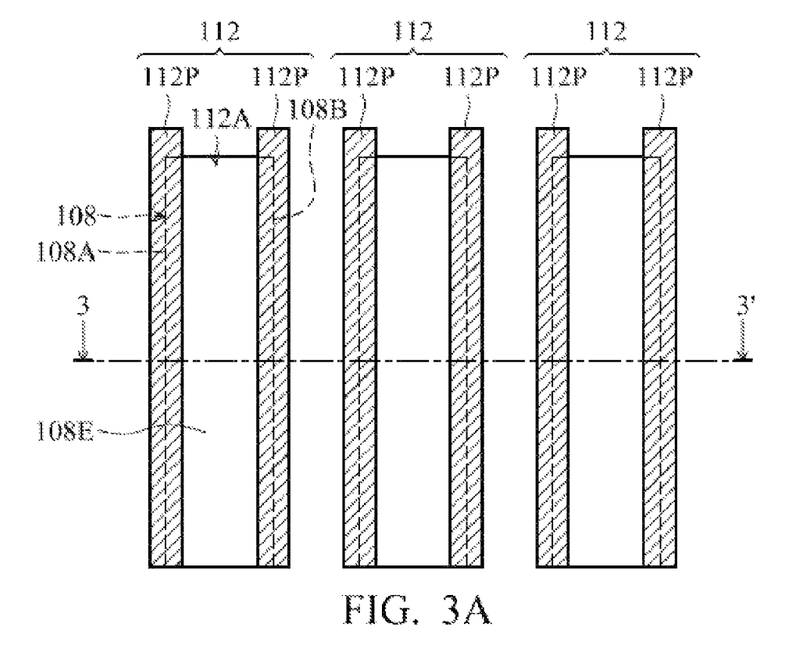
FIG. 3A shows an illustrative plane view of a protection component and a bonding pad in the dotted-line area A of FIG. 1 according to an embodiment of the disclosure.
Figure 3B:
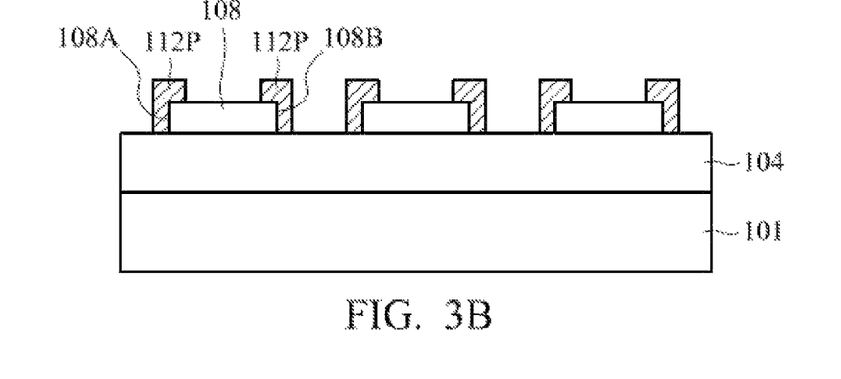
FIG. 3B shows an illustrative cross section of a touch panel along the cross section line 3-3' of FIG. 3A.

Referring to FIG. 3A, a plane view of protection components and bonding pads in the dotted-line area A of FIG. 1 according to an embodiment of the present disclosure is shown. Referring to FIG. 3B, a cross section of the touch panel along the cross section line 3-3' of FIG. 3A is shown. The bonding pad 108 further comprises a top surface 108E adjacent to the first long side 108A, the second long side 108B, the first short side 108C, and the second short side 108D which is the same as the structure of the bonding pad of the embodiment mentioned above. The difference between the embodiment of FIGS. 3A-3B and the embodiment of FIGS. 2A-2B is that the protection component 112 of the embodiment as shown in FIGS. 3A-3B further extends to cover the top surface 108E of the bonding pad 108 and has at least an opening 112A to expose a portion of the top surface 108E of the bonding pad 108. The exposed top surface 108E of the bonding pad 108 through the opening 112A is provided for electrically connecting the bonding pad 108 with a flexible printed circuit board (not shown in FIG. 3A). Each of the bonding pads 108 corresponds to a respective protection component 112 and the protection component 112 is composed of two sheet structures 112P which are disposed apart from each other. Each of the sheet structures 112P continuously and completely covers the first long side 108A and the second long side 108B of the bonding pad 108, such that the protection component 112 can completely protect the two long sides of the bonding pad 108 against the corrosion by the acid and basic solutions and the cleaning liquid used in the subsequent processes. Thus, the issue of corrosion of the edges of the bonding pad 108 can be overcome.

Figure 4A:
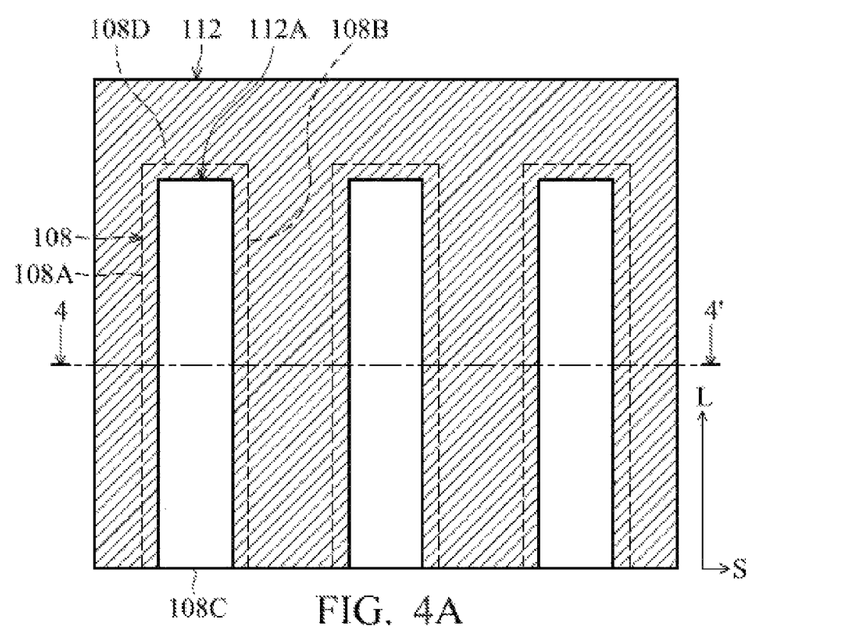
FIG. 4A shows an illustrative plane view of a protection component and a bonding pad in the dotted-line area A of FIG. 1 according to an embodiment of the disclosure.
Figure 4B:
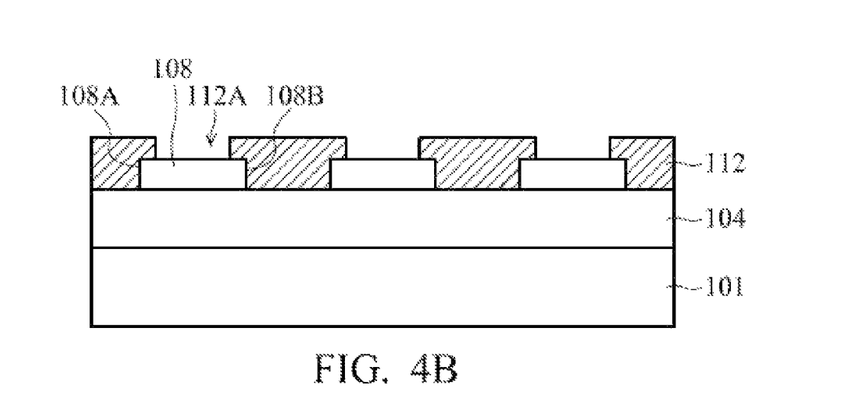
FIG. 4B shows an illustrative cross section of a touch panel along the cross section line 4-4' of FIG. 4A.

Referring to FIG. 4A, a plane view of protection components and bonding pads in the dotted-line area A of FIG. 1 according to an embodiment of the present disclosure is shown. Referring to FIG. 4B, a cross section of the touch panel along the cross section line 4-4' of FIG. 4A is shown. As shown in FIG. 4A, the bonding pads 108 are disposed apart from each other and a gap is formed between any two adjacent bonding pads 108. The structure of the bonding pads 108 of this embodiment is the same as the structures of the bonding pads of the embodiments mentioned above. The difference between the embodiment of FIGS. 4A-4B and the embodiment of FIGS. 3A-3B is that the protection component 112 of the embodiment as shown in FIGS. 4A-4B further covers the gap between the two adjacent bonding pads 108. The protection component 112 connects with the second long side 108B of a bonding pad 108 and the first long side 108A of another adjacent bonding pad 108. Moreover, the protection component 112 may further extend to cover the second short side 108D of the bonding pad 108. Therefore, each protection component 112 corresponding to each bonding pad 108 can be combined to form a whole plane structure. The first long side 108A, the second long side 108B and the second short side 108D of the bonding pad 108 are all covered with the protection component 112. The opening 112A is formed at the location of the bonding pad 108 bonded with a flexible printed circuit board (not shown in FIG. 4A) to provide an electrical connection between the bonding pad 108 and the flexible printed circuit board. In addition, FIG. 4A shows the first short side 108C of the bonding pad 108 not completely covered with the protection component 112. However, in the other embodiment, the opening 112A of the protection component 112 can be decreased slightly to make the first short side 108C of the bonding pad 108 be continuously and completely covered with the protection component 112. Therefore, each side of the bonding pad 108 can be protected by the protection component 112.

Figure 5A:
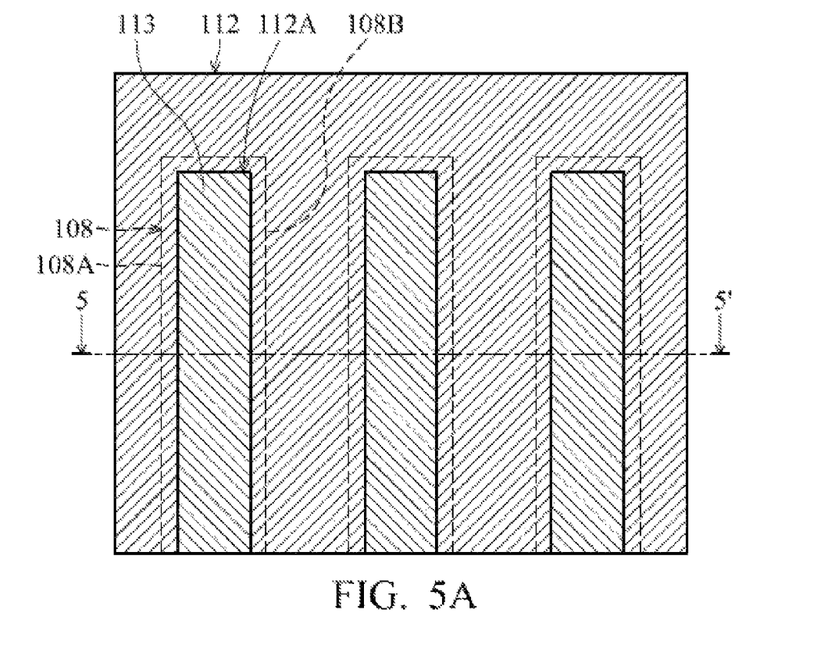
FIG. 5A shows an illustrative plane view of a protection component and a bonding pad in the dotted-line area A of FIG. 1 according to an embodiment of the disclosure.
Figure 5B:
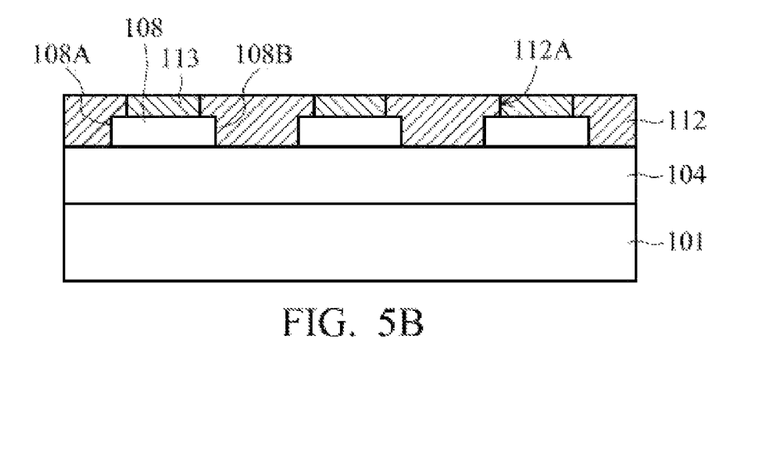
FIG. 5B shows an illustrative cross section of a touch panel along the cross section line 5-5' of FIG. 5A.

Referring to FIG. 5A, a plane view of protection components and bonding pads in the dotted-line area A of FIG. 1 according to an embodiment of the present disclosure is shown. Referring to FIG. 5B, a cross section of the touch panel along the cross section line 5-5' of FIG. 5A is shown. The difference between the embodiment of FIGS. 5A-5B and the embodiment of FIGS. 4A-4B is that the opening 112A of the protection component 112 of FIGS. 5A-5B is further filled with a conductive component 113. As shown in FIG. 5B, the top surface of the conductive component 113 is level with the top surface of the protection component 112. The difference between the height of the protection component 112 and the height of the bonding pad 108 can be filled by the conductive component 113. Moreover, the conductive component 113 disposed on the bonding pad 108 can further ensure the conductive function of the bonding pad 108.

In an embodiment, the material of the protection component 112 as shown in FIG. 5A may be an insulating material, for example polyimide, and the material of the conductive component 113 may be a transparent conductive material, for example indium tin oxide (ITO) or an opaque conductive material, such as metal. In the embodiment, the protection component 112 and the opening 112A of the protection component 112 can be formed by a coating, exposure and development process, or using a printing process to directly form the protection component 112 having the opening 112A. Next, the conductive component 113 can be formed in the opening 112A of the protection component 112 by a vapor deposition process or by using a coating, exposure and development process to form the conductive component 113.

Moreover, the conductive component 113 can be formed with the other conductive components of the touch-sensing structure in the same step to simplify the fabrication processes of the touch panel.

In another embodiment, the material of the protection component 112 as shown in FIG. 5A may be a metal oxide, for example copper oxide, and the material of the conductive component 113 may be a metal, for example copper. In the embodiment, firstly, a metal layer is formed over the bonding pads 108, and then a predetermined area for forming a protection component is treated with oxidation to oxidize the metal at the predetermined area to form a non-conductive protection component 112. The metal at the conductive area over the bonding pad 108 is not treated with oxidation to form the conductive component 113. Therefore, the protection component 112 and the conductive component 113 are formed as an integrated structure.

Figure 6A:
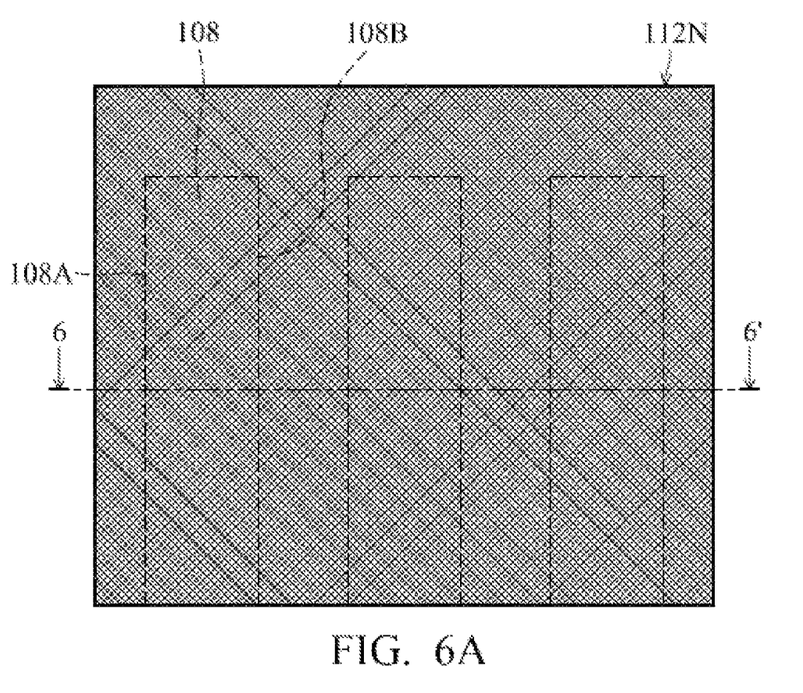
FIG. 6A shows an illustrative plane view of a protection component and a bonding pad in the dotted-line area A of FIG. 1 according to an embodiment of the disclosure.
Figure 6B:
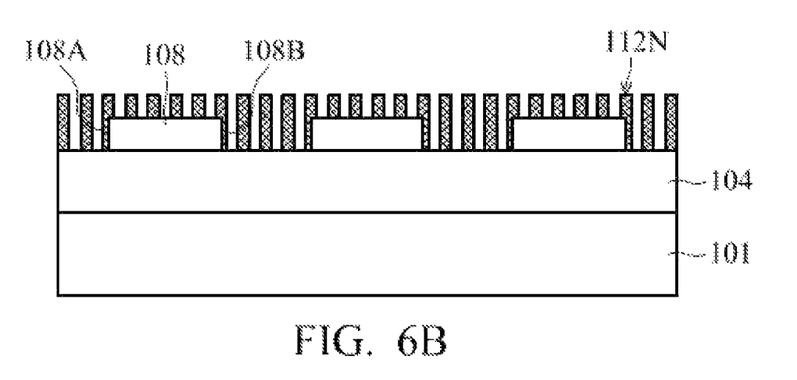
FIG. 6B shows an illustrative cross section of a touch panel along the cross section line 6-6' of FIG. 6A.

Referring to FIG. 6A, a plane view of protection components and bonding pads in the dotted-line area A of FIG. 1 according to an embodiment of the present disclosure is shown. Referring to FIG. 6B, a cross section of the touch panel along the cross section line 6-6' of FIG. 6A is shown. The difference between the embodiment of FIGS. 6A-6B and the embodiment of FIGS. 4A-4B is that the protection component 112 of FIGS. 6A-6B comprises a plurality of strips crossing each other. The strips of protection components 112 corresponding to each bonding pad 108 are integrated to form an insulating net-shaped structure 112N on the bonding pads 108 and at the gap between any two adjacent bonding pads 108. The meshes of the net-shaped structure 112N can be regarded as the openings of the protection components as described in the embodiments mentioned above. Conductive glue is disposed in the meshes between the strips of the net-shaped structure 112N to ensure the bonding pads 108 electrically connecting with a flexible printed circuit board through the conductive glue. In the embodiment, the material of the net-shaped structure 112N may be an insulating material, for example polyimide. The net-shaped structure 112N can be formed by a screen printing method.

Figure 7A:
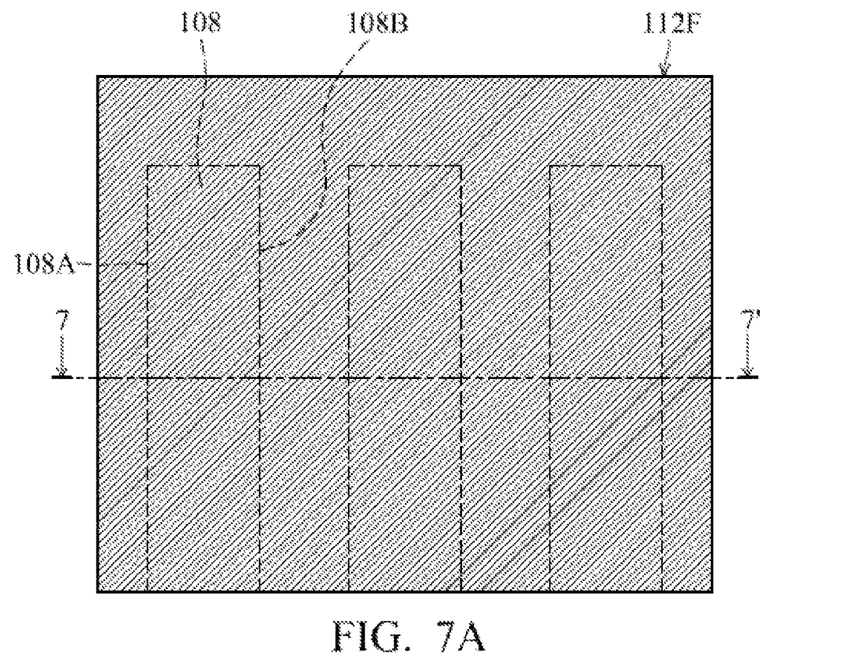
FIG. 7A shows an illustrative plane view of a protection component and a bonding pad in the dotted-line area A of FIG. 1 according to an embodiment of the disclosure.
Figure 7B:
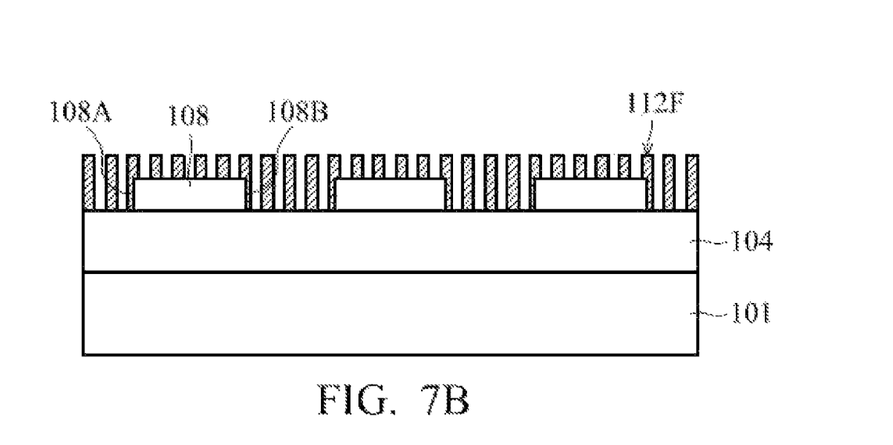
FIG. 7B shows an illustrative cross section of a touch panel along the cross section line 7-7' of FIG. 7A.

Referring to FIG. 7A, a plane view of protection components and bonding pads in the dotted-line area A of FIG. 1 according to an embodiment of the present disclosure is shown. Referring to FIG. 7B, a cross section of the touch panel along the cross section line 7-7' of FIG. 7A is shown. The difference between the embodiment of FIGS. 7A-7B and the embodiment of FIGS. 4A-4B is that the protection component 112 of FIGS. 7A-7B comprises a plurality of strips parallel to each other. The strips of protection component 112 corresponding to each bonding pad 108 are integrated to form an insulating fence-shaped structure 112F on the bonding pads 108 and at the gaps between any two adjacent bonding pads 108. These strips of the fence-shaped structure 112F can be tilted at any angle with respect to the first long side 108A and the second long side 108B of the bonding pad 108. The gaps between the strips of the fence-shaped structure 112F can be regarded as the openings of the protection components as described in the aforementioned embodiments. Conductive glue is disposed in the gaps between the strips of the fence-shaped structure 112F to ensure the bonding pads 108 electrically connect with a flexible printed circuit board through the conductive glue. In an embodiment, the material of the fence-shaped structure 112F may be an insulating material, for example polyimide. The fence-shaped structure 112F can be formed by a screen printing method.

Figure 8:
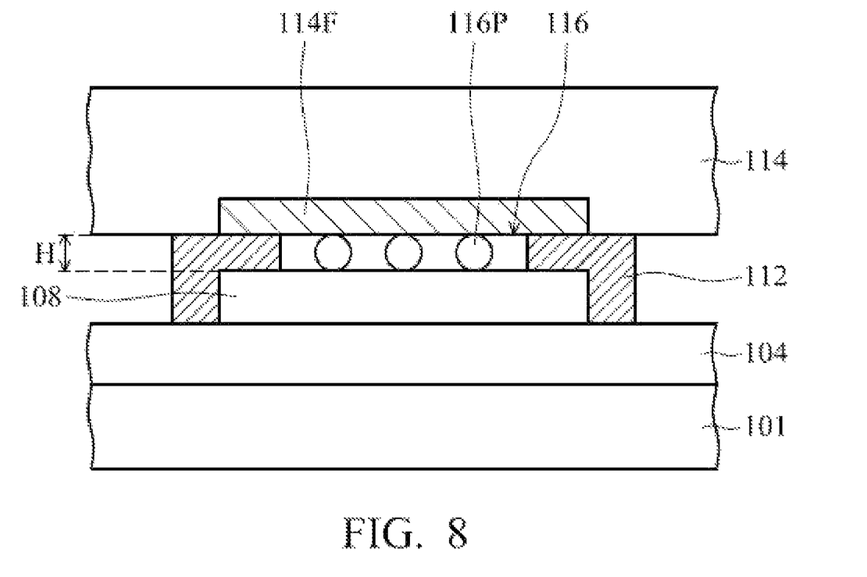
FIG. 8 shows an illustrative cross section of a bonding pad of a touch panel bonded with a flexible printed circuit board according to an embodiment of the disclosure.

Referring to FIG. 8, a cross section of a bonding pad of a touch panel bonded with a flexible printed circuit board according to an embodiment of the invention is shown. In order to clarify the drawing, there is one bonding pad 108 shown in FIG. 8 as a representative. However, the touch panel usually includes a plurality of bonding pads 108 to bond with the flexible printed circuit board 114. Moreover, the protection component 112 as shown in FIG. 8 is illustrated with the sheet structure 112P of FIGS. 3A-3B as an example. However, the other structures of the protection component 112 as shown in FIGS. 4A-4B, FIGS. 5A-5B, FIGS. 6A-6B and FIGS. 7A-7B can also be applied to the embodiment of FIG. 8.

As shown in FIG. 8, the touch panel further comprises conductive glue 106 and a flexible printed circuit board 114. The conductive glue 106 can be disposed or bonded on the bonding pad 108 for bonding between the flexible printed circuit board 114 and the bonding pad 108. The bonding pad 108 is bonded with a metal pad 114F of the flexible printed circuit board 114 through the conductive glue 106. The conductive glue 106 contains a plurality of conductive particles 116P. After the bonding pad 108 is bonded with the flexible printed circuit board 114 by a compression bonding process, the conductive particles 116P in the conductive glue 106 can conduct electricity between the bonding pad 108 and the metal pad 114F of the flexible printed circuit board 114. The conductive particles 116P have a first thickness T1 before performing the aforementioned compression bonding process, i.e., the conductive particles 116P have the first thickness T1 itself before bonding to the bonding pad 108. After the compression bonding process, the conductive particles 116P have a reduced second thickness T2. According to the embodiments of the present disclosure, the protection component 112 having the opening is disposed on the bonding pad 108 and the opening of the protection component 112 has an opening height H. The pressure produced from the compression bonding process may cause the conductive particles 116P to prick the underlying layers. However, the second thickness T2 of the conductive particles 116P after the compression bonding process can be controlled by the opening height H of the protection component 112. Thus, it can prevent the conductive particles 116P from pricking the bonding pad 108 and the other element layers formed of soft materials on the surface of the cover lens 101, such as the mask layer 104.

In an embodiment, while the conductive particles 116P have a first thickness T1 of about 4 µm before performing the compression bonding process, the opening height H of the protection component 112 may be about 0.8 µm-2.5 µm. In another embodiment, while the conductive particles 116P have a first thickness T1 of about 10 µm before performing the compression bonding process, the opening height H of the protection component 112 may be about 1.2 µm-4.0 µm. According to the embodiments of the present disclosure, the opening height H of the protection component 112 may be about 0.1-0.7 times the first thickness T1 of the conductive particles 116P, preferably about 0.5 times. In addition, after performing the compression bonding process, the second thickness T2 of the conductive particles 116P may be substantially equal to the opening height H of the protection component 112.

Figure 9:
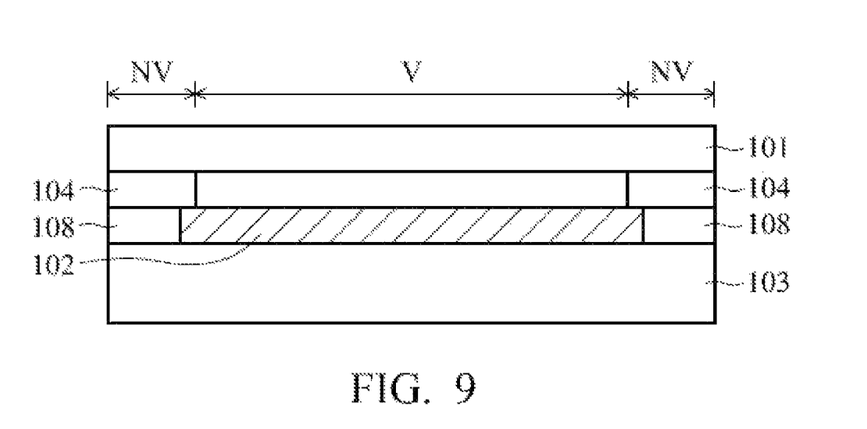
FIG. 9 shows an illustrative cross section of a touch panel structure according to an embodiment of the disclosure.

In the embodiments described above, the touch-sensing structure 102 is directly formed on the lower surface of the cover lens 101 (a touch side of the cover lens 101 is referred to as an upper surface) and the bonding pad 108 is disposed on the mask layer 104. However, it is not used to limit the present disclosure. Referring to FIG. 9, a cross section of a touch panel structure according to an embodiment of the invention is shown. The difference between the embodiment of FIG. 9 and FIG. 8 is that the touch panel of FIG. 9 further comprises a substrate 103. The touch-sensing structure 102 is formed on the substrate 103. The bonding pad 108 is formed on the substrate 103 and shielded with the mask layer 104. As shown in FIG. 9, the touch panel comprises the cover lens 101, the touch-sensing structure 102, the mask layer 104, the substrate 103 and the bonding pad 108. Further, the protection component (not shown in FIG. 9) is disposed on the bonding pad 108. The protection component can be any type of protection component as described in the embodiments mentioned above, and it is not repeated again. The cover lens 101 has an upper surface and a lower surface opposite to the upper surface, wherein the upper surface is a touch side provided for users. The mask layer 104 is formed on the lower surface of the cover lens 101, thus the cover lens 101 is divided into the viewable area V and the non-viewable area NV. The mask layer 104 is disposed at the non-viewable area NV. The substrate 103 is disposed under the cover lens 101 and the substrate can also be divided into the viewable area V and the non-viewable area NV corresponding to the viewable area V and the non-viewable area NV defined at the cover lens 101. The substrate 103 can be used as a carrier for the touch-sensing structure 102. The touch-sensing structure 102 is formed on the substrate 103 at the viewable area V. In other words, the touch-sensing structure 102 can be disposed between the substrate 103 and the cover lens 101 or disposed on a surface of the substrate 103 opposite to another surface facing the cover lens 101. The bonding pad 108 is formed on the substrate 103 at the non-viewable area NV and shielded with the mask layer 104. In other words, the bonding pad 108 can be disposed between the substrate 103 and the mask layer 104 or disposed on a surface of the substrate 103 opposite to another surface facing the mask layer 104.

According to the embodiments of the present disclosure, the protection component is disposed at least on the sides of the bonding pad, such that the sides of the bonding pad are not exposed. Therefore, the sides of the bonding pad can be protected by the protection component to avoid damage from the environment or the other processes of fabricating the touch panel. Moreover, when the bonding pad is in contact with the mask layer, the adhesion between the bonding pad and the mask layer is enhanced and a problem of the bonding pad peeling from the mask layer can be overcome. Therefore, the production yield of the touch panel is improved and the reliability of the touch panel is also enhanced.

Furthermore, according to the embodiments of the present disclosure, the thickness of the conductive particles in the conductive glue after performing the compression bonding process can be controlled by the opening height of the protection component. Thus, it can prevent the conductive particles from pricking the bonding pad or damaging the other element layers under the bonding pad and made from soft materials after the compression bonding process is performed.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A touch panel, comprising:
a plurality of bonding pads, wherein each of the bonding pads includes a first long side, a second long side, a first short side, and a second short side, wherein the first long side is adjacent to the first short side and the second short side, and opposite to the second long side;
a touch-sensing structure electrically connected to the first short side of each of the bonding pads; and
a protection structure disposed corresponding to each of the bonding pads, wherein the protection structure includes a pair of protection components covering a side surface of the first long side and a side surface of the second long side.

2. The touch panel of claim 1, wherein the protection structure further includes an auxiliary protection component covering a side surface of the second short side of each of the bonding pads.

3. The touch panel of claim 1, wherein each of the bonding pads further comprises a top surface connected to the first long side, the second long side, the first short side, and the second short side, and each of the pair of protection components further extends to the top surface of each of the bonding pads and at least one opening is defined between the pair of protection components to expose a part of the top surface of each of the bonding pads.

4. The touch panel of claim 3, wherein the bonding pads are disposed apart from each other, a gap is formed between the adjacent bonding pads, and the protection structure fills into the gap between the adjacent bonding pads.

5. The touch panel of claim 3, wherein the protection structure further comprises a conductive component filling in the opening to cover the exposed part of the top surface of each of the bonding pads, and wherein the conductive component is made of a metal material and the pair of protection components are made of an oxidation of the metal material of the conductive component.

6. The touch panel of claim 5, wherein the conductive component is made of copper, and the pair of protection components is made of copper oxide.

7. The touch panel of claim 5, wherein the conductive component and the pair of protection components are an integrated structure covering the side surface of the first long side, the side surface of the second long side and the top surface of each bonding pad.

8. The touch panel of claim 3, wherein the material of the conductive component comprises a metal copper or ITO, and the material of the pair of protection components comprises polyimide.

9. The touch panel of claim 3, further comprising a conductive glue bonded onto the bonding pads, wherein the conductive glue includes a plurality of conductive particles, the conductive particles have a first thickness before bonding onto the bonding pads, the opening has a height, and wherein the height of the opening is 0.1-0.7 times the first thickness.

10. The touch panel of claim 9, wherein the height of the opening is 0.5 times the first thickness.

11. The touch panel of claim 10, further comprising a flexible printed circuit board, wherein the conductive glue is bonded between the flexible printed circuit board and the bonding pads, the conductive particles have a second thickness after the flexible printed circuit board is bonded to the bonding pads, and the second thickness is equal to the height of the opening.

12. The touch panel of claim 1, wherein the material of the protection structure comprises an insulating material.

13. The touch panel of claim 1, wherein each of the bonding pads further comprises a top surface, and the protection structure comprises a plurality of strips and the strips of the protection structure are integrated to form an insulating net-shaped structure covering the top surface, the side surface of the first long side and the side surface of the second long side of each bonding pad, and the insulating net-shaped structure has meshes so that a conductive glue filled into the meshes makes an electrical connection between the top surface of each of the bonding pads and a circuit board disposed on the protection structure.

14. The touch panel of claim 1, wherein each of the bonding pads further comprises a top surface, and the protection structure comprises a plurality of strips and the strips of the protection structure are integrated to form an insulating fence-shaped structure covering the top surface, the side surface of the first long side and the side surface of the second long side of each bonding pad, and the insulating fence-shaped structure has gaps so that a conductive glue filled into the gaps makes an electrical connection between the top surface of each of the bonding pads and a circuit board disposed on the protection structure.

15. The touch panel of claim 1, further comprising:
   a cover lens, having a lower surface; and
   a mask layer disposed under the lower surface of the cover lens, wherein the cover lens is defined by the mask layer to have a viewable area and a non-viewable area, the mask layer is located at the non-viewable area, the touch-sensing structure is disposed under the lower surface of the cover lens and located at the viewable area, the bonding pads are disposed on the mask layer and shielded by the mask layer.

16. The touch panel of claim 1, further comprising:
   a cover lens, having a lower surface;
   a mask layer disposed under the lower surface of the cover lens, wherein the cover lens is defined by the mask layer to have a viewable area and a non-viewable area, and the mask layer is located at the non-viewable area; and
   a substrate disposed under the cover lens, wherein the touch-sensing structure is disposed on the substrate and located at the viewable area, the bonding pads are disposed on the substrate and shielded by the mask layer.

* * * * *